United States Patent
Miura et al.

(10) Patent No.: US 7,541,949 B2
(45) Date of Patent: Jun. 2, 2009

(54) RECEIVING DEVICE AND TIRE PRESSURE MONITORING SYSTEM

(75) Inventors: Yukio Miura, Miyagi-ken (JP); Noriyuki Honda, Miyagi-ken (JP); Hiroshi Ishikawa, Miyagi-ken (JP); Ryo Teramachi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/018,502

(22) Filed: Jan. 23, 2008

(65) Prior Publication Data

US 2008/0111717 A1      May 15, 2008

Related U.S. Application Data

(63) Continuation of application No. 11/418,743, filed on May 4, 2006, now Pat. No. 7,342,519.

(30) Foreign Application Priority Data

May 13, 2005      (JP) .............................. 2005-141299

(51) Int. Cl.
 *H03M 7/12*      (2006.01)
(52) U.S. Cl. ........................................ 341/70; 375/361
(58) Field of Classification Search ................... 341/70, 341/69, 71; 340/870.1; 375/361, 358
See application file for complete search history.

(56) References Cited

U.S. PATENT DOCUMENTS

| | | | | |
|---|---|---|---|---|
| 4,462,051 A * | 7/1984 | Chan | ............................ | 360/44 |
| 5,663,496 A * | 9/1997 | Handfield et al. | ........... | 73/146.5 |
| 6,362,731 B1 * | 3/2002 | Lill | ............................ | 340/445 |
| 6,963,295 B1 * | 11/2005 | Greene et al. | ................. | 341/70 |
| 7,342,519 B2 * | 3/2008 | Miura et al. | ................... | 341/70 |

* cited by examiner

*Primary Examiner*—Peguy JeanPierre
(74) *Attorney, Agent, or Firm*—Brinks Hofer Gilson & Lione

(57) ABSTRACT

A receiving device is provided. A pulse width is measured, it is selected whether a determination process is performed for a pulse width having the length of one bit in accordance with the measured value of the pulse width or a pulse width having the length of ½ bit, it is discriminated whether a current pulse edge is a pulse edge at the center of the bit or a pulse edge at the boundary between bits while considering the bit data right before the determined bit, and when it is determined that the current pulse edge is the pulse edge at the center of the bit, the bit data is determined by the rising edge or the falling edge of the pulse edge.

8 Claims, 7 Drawing Sheets

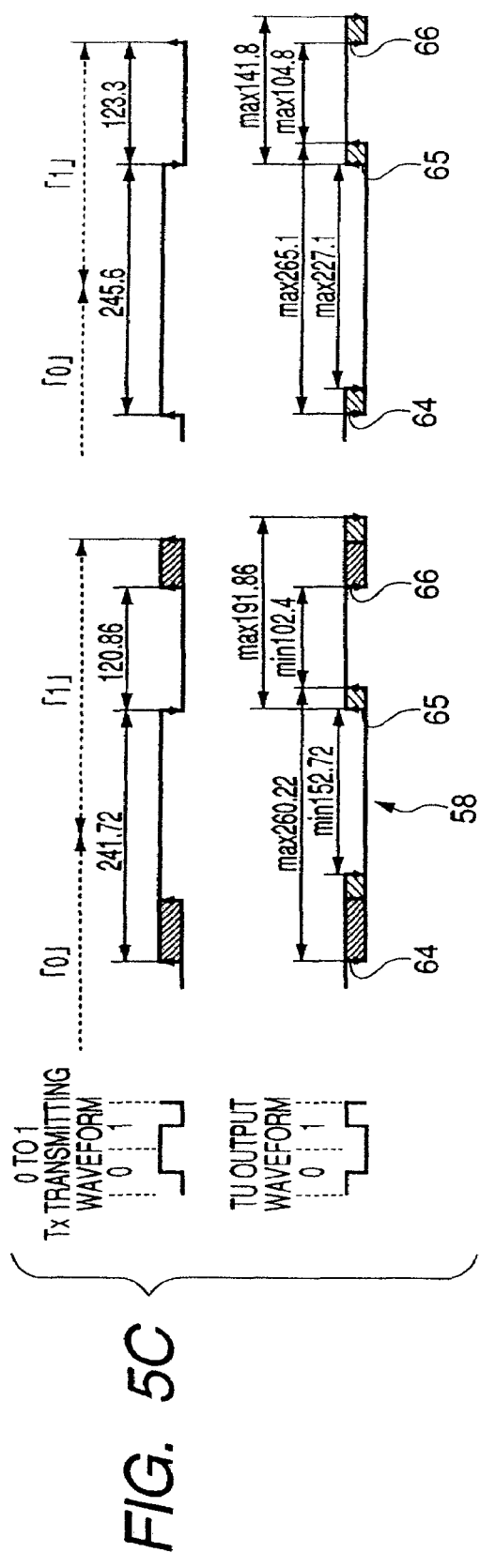
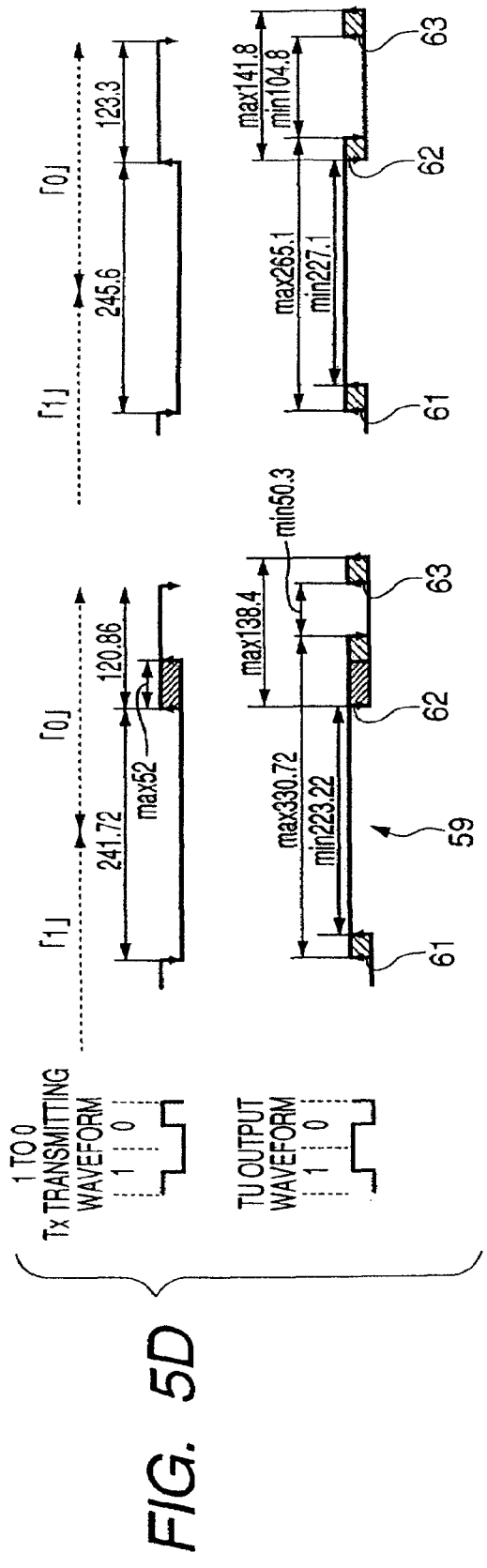
FIG. 5C
FIG. 5D

RECEIVING DEVICE AND TIRE PRESSURE MONITORING SYSTEM

CROSS-REFERENCES TO RELATED APPLICATIONS

This application is a continuation of U.S. application Ser. No. 11/418,743, filed May 4, 2006, now U.S. Pat. No. 7,342,519 titled "Receiving Device and Tire Pressure Monitoring System," which claims the benefit of priority to Japanese Patent Application No. 2005-141299, filed May 13, 2005, both of which are incorporated by reference herein.

BACKGROUND OF THE INVENTION

1. Field of the Invention

The present invention relates to a receiving device, and more particularly, to a receiving device that receives data encoded with a Manchester code and a tire pressure monitoring system using the receiving device.

2. Description of the Related Art

In recent years, a tire pressure monitoring system (hereinafter, referred to as TPMS) mounted in a vehicle has been disclosed. In the TPMS, a transmitter having a built-in battery is installed in a tire, and tire pressure data transmitted from the transmitter is received by a receiver installed in a vehicle body. In the wireless communication, two kinds of modulation methods, such as FM or AM, are generally used. According to the FM method, since an electric wave is continuously transmitted, a consumed capacity in the battery of the transmitter is very large. In order to resolve this problem, if the transmission speed is increased so as to reduce the transmission time or the number of transmissions is reduced so as to decrease the consumed capacity of the battery, the reliability of the communication may be deteriorated. According to the AM method, only when an electric wave is transmitted, since a transmission circuit may be operated, the transmission circuit can be operated for a longer period of time, and the data transmitting speed or the number of the transmissions can be increased, as compared with the case in which the FM method is used.

As for a method of encoding the tire pressure data, a Manchester code method or an NRZ (Non Return to Zero) code method is generally used. In the Manchester code method, the bit data (logical value) is represented by the rising edge or falling edge of the pulse at the center of the bit. In addition, even if the same bit data (logical value) is continuous, since the H or L of the signal level is not continuous, the determination is easy, and the transmission circuit can be operated for a longer period of time, as compared with the NRZ code method. In addition, since the Manchester code method is a code method that has strong resistance against the noise, it is preferable. In the Manchester code method according to the related art, a decoding process is performed by determining whether a rising edge or a falling edge of a pulse exists between bits (for example, see JP-T-08-507735).

The tire pressure monitoring system has a structure having a transmission device mounted in a tire, a receiving device mounted in a vehicle body, and tire pressure data transmitted from the transmission device to the receiving device. In this structure, the ambient temperature of the transmitting device rapidly varies by the heat emitted from a brake or a tire, and a carrier wave frequency of a transmission electric wave, a pulse width, a rising or falling timing of a pulse, or the like vary. Due to this variation, the bit data may be erroneously determined in the receiving device, and thus it is not possible to perform the decoding process of the data with high reliability.

SUMMARY OF THE INVENTION

The present invention has been finalized in view of the drawbacks inherent in the conventional receiving device and tire pressure monitoring system, and it is an object of the present invention to provide a receiving device, which is capable of decoding data with high reliability even if a carrier wave frequency, a pulse width, the timing of rising and falling edges of a pulse, or the like vary, and a tire pressure monitoring system.

A receiving device according to a first aspect of the invention includes: a receiving unit that receives data encoded with a Manchester code having a high pulse and a low pulse combined with each other so as to represent a bit; a measuring unit that measures a pulse width of the encoded data; a determining unit that determine the existence of rising edge or a falling edge of a pulse end, and a determining unit that determines a bit value of the encoded data on the basis of the pulse width, the rising edge or falling edge of the pulse end, and a bit data of a bit before the determined bit.

According to this aspect, the bit data of the encoded data is determined on the basis of the pulse width, the determination of the rising edge or the falling edge of the pulse end, and the bit data of the bit before the determined bit. The data encoded with the Manchester code is characterized by the pulse representing the bit. That is, there is the regularity in the relationship between the determined bit and the bit before the determined bit. For this reason, the bit data is determined on the basis of the relationship, the data of the pulse width, and the determination of the rising edge or falling edge of the pulse end. As a result, the bit data can be determined without the erroneous determination even if the carrier wave frequency, the pulse width, and the timing of the rising edge or falling edge of the pulse vary.

According to this aspect, it can be determined whether the pulse edge of the pulse width having the length of ½ bit in the Manchester code is the pulse edge at the center of the bit used for the determination of the bit data or the pulse edge at the boundary between bits that are not used for the determination of the bit data, which results in accurate determination of the bit data.

A tire pressure monitoring system according to a second aspect of the invention includes: the above-mentioned receiving device and a transmitting device comprising an encoding unit that encodes data indicating a tire pressure with a Manchester code, having a high pulse and a low pulse are combined with each other so as to represent a bit, so as to obtain encoded data; a transmitting unit to transmit the encoded data.

According to this aspect, the bit data of the encoded data is determined on the basis of the pulse width, the determination of the rising edge or the falling edge of the pulse end, and the bit data of the bit before the determined bit. The data that is encoded with the Manchester code is characterized by the pulse representing the bit. That is, there is the regularity in the relationship between the determined bit and the bit before the determined bit. For this reason, the bit data is determined on the basis of the relationship, and the data of the pulse width. Therefore, the bit data can be determined without the erroneous determination even if the carrier wave frequency, the pulse width, and the timing of the rising edge or falling edge of the pulse vary. Therefore, it is possible to display the detected tire pressure on the display as the accurate tire pressure data, and it is possible to make the accurate tire pressure data known to the driver.

BRIEF DESCRIPTION OF THE DRAWINGS

FIGS. 5A to 5D are diagrams illustrating deformation of a waveform of data that is encoded with a Manchester code;

DESCRIPTION OF THE PREFERRED EMBODIMENT

Preferred embodiments of the present invention will now be described in detail with reference to the accompanying drawings.

Figure 1:
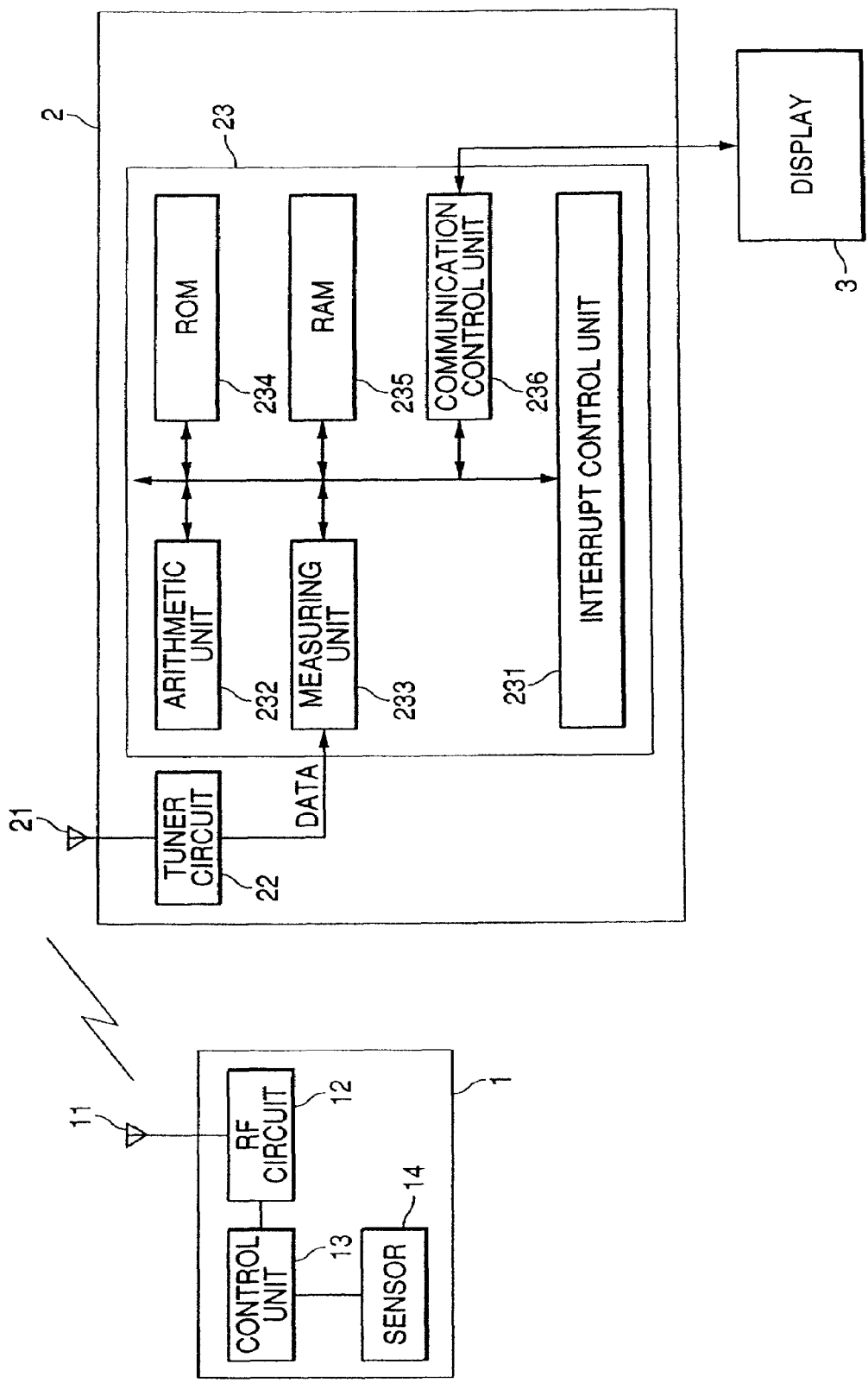
FIG. 1 is a block diagram schematically illustrating a tire pressure monitoring system according to an embodiment of the invention.

FIG. 1 is a block diagram schematically illustrating a tire pressure monitoring system according to an embodiment of the invention. The tire pressure monitoring system shown in FIG. 1 mainly includes a transmitting device 1 that transmits data encoded with a Manchester code, and a receiving device 2 that receives the encoded data transmitted from the transmitting device 1 and decodes it. The transmitting device 1 is mounted in the tire and the receiving device 2 is mounted in a vehicle body. Further, the data decoded by the receiving device 2 is transmitted to a display 3 that is disposed in the vehicle body, when the decoded data is required.

The transmitting device 1 includes a sensor 14 that detects a tire pressure, a control unit 13 that encodes data indicating the tire pressure detected by the sensor 14 with the Manchester code, and an RF circuit 12 that modulates a carrier wave with the encoded tire pressure data (encoded data) and transmits it to the receiving device 2 through an antenna 11.

Figure 2:
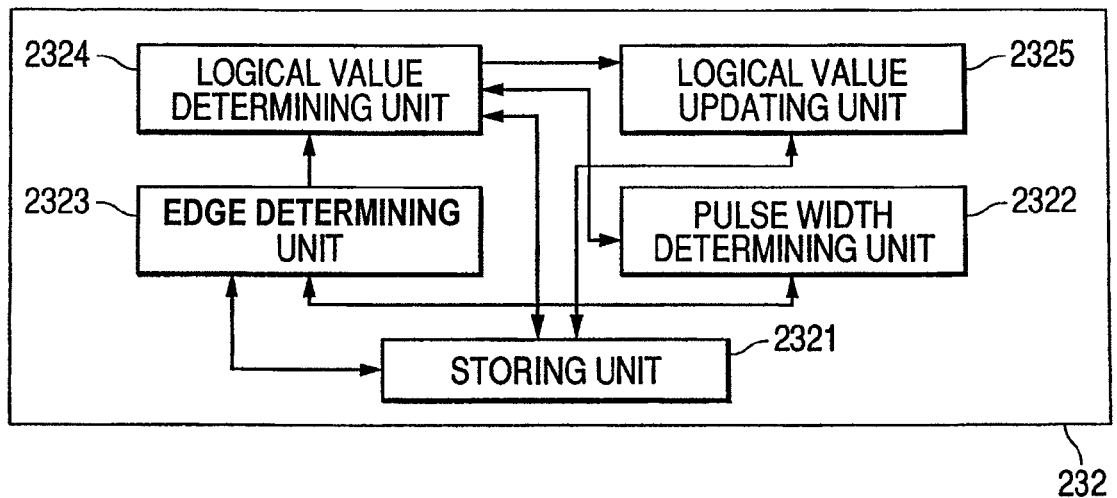
FIG. 2 is a block diagram schematically illustrating a structure of an arithmetic unit in a control unit of a receiving device shown in FIG. 1.

The receiving device 2 mainly includes a tuner circuit 22 that receives an electric wave transmitted from the transmitting device 1 through the antenna 21, and a control unit 23 that decodes the encoded data received by the tuner circuit 22 and transmits the decoded tire pressure data to the display 3. Further, the control unit 23 includes an interruption control unit 231 that controls the interruption of the measurement of a pulse width of the data encoded with the Manchester code, a measuring unit 233, such as a timer, a counter, or the like, that measures a pulse width of the encoded data, an arithmetic unit 232 that performs the arithmetic for determining a bit data of the encoded data, an ROM 234 that stores control program or the like, an RAM 235 that stores various data so as to be rewritten, and a communication control unit 236 that performs the control when the decoded tire pressure data is transmitted to the display 3. Further, as shown in FIG. 2, the arithmetic unit 232 of the control unit 23 has a storing unit 2321 that stores pulse width data or pulse edge data, a pulse width determining unit 2322 that determines a pulse width, an edge determining unit 2323 that determines the rise or fall of a pulse edge, a logical value determining unit 2324 (determination unit) that determines a bit data of the encoded data end on the basis of the pulse width, the determination of the rising edge or the falling edge of the pulse end, and a bit data of a bit before the determined bit, and a logical value updating unit 2325 that updates the bit data stored in the storing unit 2321 into a bit data of the encoded data that has determined by the logical value determining unit 2324.

In the tire pressure monitoring system having the above-mentioned structure, a tire pressure is detected by the sensor 14 of the transmitting device 1 that is mounted in the tire of a vehicle. In this case, a method of detecting the tire pressure is not limited to a specific method. The tire pressure data, which has been detected by the sensor 14, is encoded by the control unit 13 using a Manchester code such that the encoded data is output to the RF circuit 12. The RF circuit 12 modulates the carrier wave with the encoded data so as to transmit it to the receiving device 2 through the antenna 11. In the receiving device 2, the electric wave, which has been transmitted from the transmitting device 1, is received in the tuner circuit 22 through the antenna 21. The tuner circuit 22 extracts the encoded data from the carrier wave that has been modulated with the encoded data, and outputs it to the measuring unit 233 of the control unit 23. The measuring unit 233 detects a pulse edge of a pulse of the encoded data, detects rising data or falling data of the pulse edge, and measures the pulse width through the control of the interrupt control unit 231 at the time of the detection. The data of the pulse width or the data of the pulse edge is output to the arithmetic unit 232. The arithmetic unit 232 decodes the encoded data on the basis of the pulse width data, the pulse edge data, and the logical value (bit data) of the bit before the determined bit, and obtains the tire pressure data. The tire pressure data is transmitted to the display 3 by the communication control unit 236, and then displayed on the display, if necessary. In addition, the decoding process of the encoded data will be described in detail below.

The decoding process of the encoded data will now be described.

The encoding method, which is used for communication in the tire pressure monitoring system according to the embodiment of the invention, corresponds to a Manchester code method. The transmitted tire pressure data is a signal, having a predetermined number of bits, of which one frame is within a range of 50 to 100 bits, and includes an ID code, pressure data, temperature data, or the like. In addition, a width of one bit corresponds to 244.14 µs (micro second).

Figure 3A:
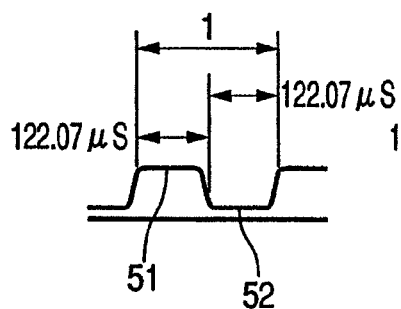
FIGS. 3A to 3C are diagrams illustrating a Manchester code.
Figure 3B:
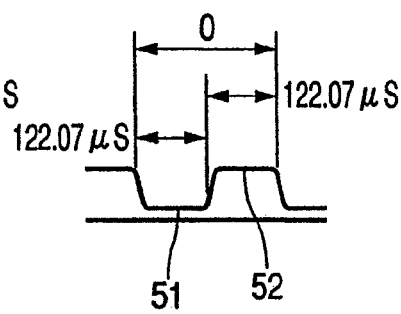
Figure 3C:
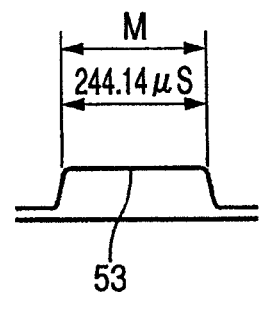

The Manchester code is shown by combining pulses of High (H) and Low (L) shown in FIGS. 3A to 3C with each other. That is, FIG. 3A shows bit data 1 (logical value), and FIG. 3B shows bit data 0 (logical value). Therefore, when the bit data is continuously (0, 0) or (1, 1), an H pulse 51 or an L pulse 52 having a length of ½ bit (122.07 µs) alternately appears. In the meantime, FIG. 3C shows a boundary portion of a bit when different bit data (logical value) is continuous, that is, continuously (1, 0) or (0, 1). In this case, it becomes a pulse 53 (M) of H or L according to the length of one bit. In addition, FIG. 3C shows a case in which the bit data is continuously (0, 1). The pulses, which are shown in FIGS. 3A to 3C, correspond to the pulses in the transmitting device, and H and L are inverted in the pulses in the receiving device.

Accordingly, the determination of the bit data is performed with pulse waveforms in the receiving device (inverted shapes of FIGS. 3A to 3C).

In the data that has been encoded with the Manchester code, as described above, since the ambient temperature of the transmitting device extremely varies due to the heat emitted from the brake or tire, the carrier wave frequency, the pulse width, and the timing of rising or falling of the pulse vary, so that the pulse shape is deformed. Specifically, the reason why the shape of the data encoded with the Manchester code is deformed is as follows. That is, since tolerance of a clock for a microcomputer in the transmitting device 1 is about ±1%, the data transmitting speed becomes 4096 bps±tolerance of 1%. In addition, since a rising time of the RF circuit 12 in the transmitting device 1 varies by the temperature, the pulse width of 122.07 μs (1/4096*1/2) of a pulse having a length of a bit of ½ varies by 122.07+0/−52 μs in the transmitting device 1. The receiving device 2 inputs, to a binarization circuit, a signal that is obtained by integrating a voltage obtained by detecting the receiving signal and a signal that is obtained by integrating a voltage detected as a reference value. As a result, a time delay occurs in the reference value, which results in a variation of a pulse width of ±15%. In this way, a minimum value and a maximum value in the variation of the pulse width are calculated as follows.

(Pulse Having Length of ½ Bit)

A minimum value of 122.07 μs=a maximum transmission speed of the transmitting device 1 (4096 bps+1%)−a variation of a rising edge of a pulse in the transmitting device 1 (52 μs)−an amount of delayed data in the receiving device 2 (122.07 μs×15%)×2 (amounts of both pulse edges)=50.33 μs.

A maximum value of 122.07 μs=a maximum transmission speed of the transmitting device 1 (4096 bps+1%)+a variation of the rising edge of a pulse in the transmitting device 1 (52 μs)+an amount of delayed data in the receiving device 2 (122.07 μs×15%)×2 (amounts of both pulse edges)=209.86 μs.

(Pulse having Length of One Bit)

A minimum value of 244.14 μs=a maximum transmission speed of the transmitting device 1 (4096 bps−1%)−an amount of delayed data in the receiving device 2 (122.07 μs×15%)×2 (amounts of both pulse edges)=152.72 μs.

A maximum value of 244.14 μs=a maximum transmission speed of the transmitting device 1 (4096 bps−1%)+an amount of delayed data in the receiving device 2 (122.07 μs×15%)×2 (amounts of both pulse edges)=330.72 μs.

Figure 4:
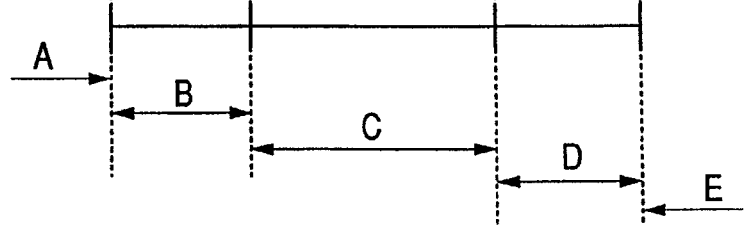
FIG. 4 is a diagram illustrating tolerance of a pulse width of encoded data in a receiving device.

FIG. 4 is a diagram illustrating a variation range of a pulse width from the result calculated from the above-mentioned calculation, that is, tolerance of the pulse width. As can be apprehended from FIG. 4, a range where tolerances overlap each other is generated between a range of a pulse width of a pulse having a length of ½ bit (a range of 122 μs) and a range of a pulse width of a pulse having a length of one bit (a range of 244 μs). Since the overlapping range of tolerances is generated due to the temperature variation or the like, erroneous determination of the bit occurs in the receiving device 2 in the conventional method. However, according to the embodiment of the invention, it is possible to provide a method of accurately performing the bit data determination even though the range where the tolerances overlap each other is generated.

Figure 5A:
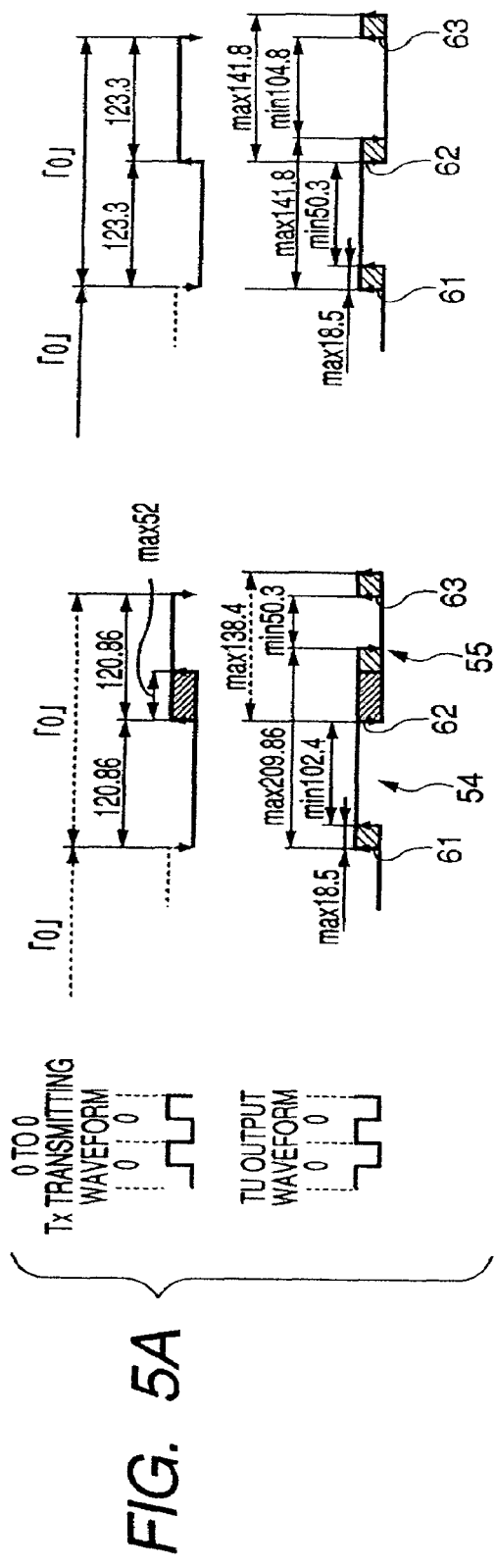
Figure 5B:
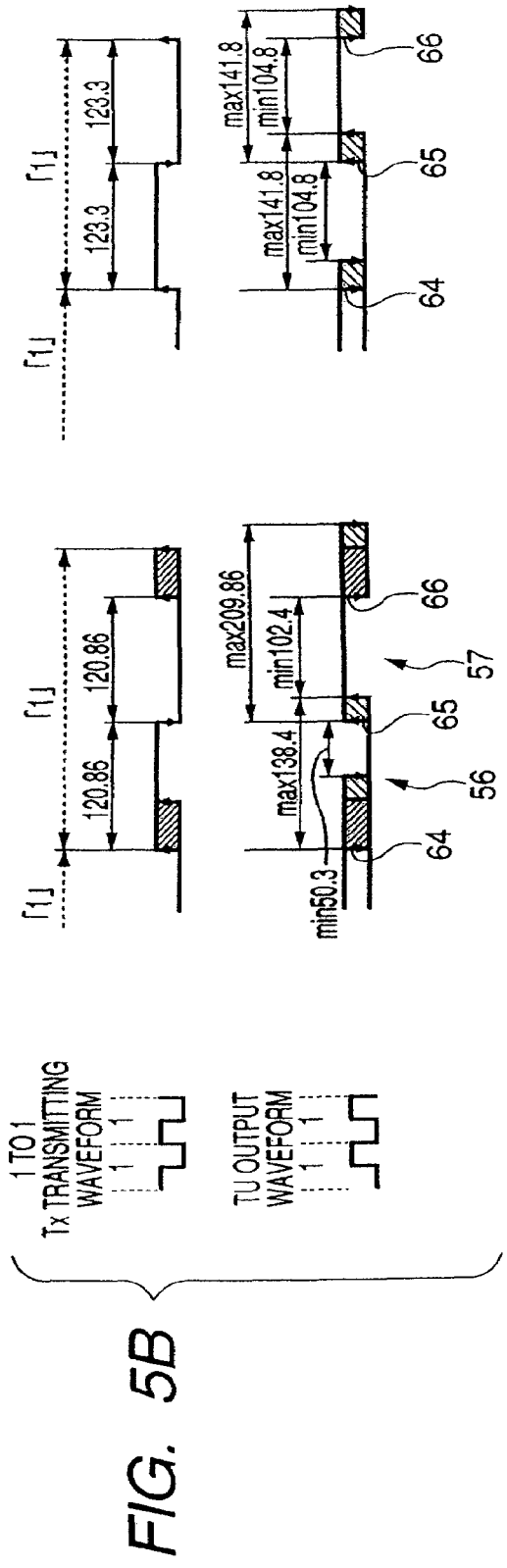

FIGS. 5A to 5D are diagrams schematically illustrating the deformation of the shape of the data encoded with the Manchester code and the determination of the bit data. In FIGS. 5A to 5D, the respective upper stages indicate transmitting waveforms (Tx) of the transmitting device 1 side, and the respective lower stages indicate output waveforms (TU) of the receiving device 2 side. In addition, in each of FIGS. 5A to 5D, the indication at the left side schematically illustrates a state in which two bit data is continuous. That is, FIG. 5A shows bit data of (0, 0), FIG. 5B shows bit data of (1, 1), FIG. 5C shows bit data of (0, 1), and FIG. 5D shows bit data of (1, 0). As apprehended from the indication, the bit data (0, 1) can be discriminated by determining whether a rising edge or a falling edge exists at a central location of the bit. In the receiving device 2, bit data in which a rising edge exists at a central location of the bit corresponds to 1, and bit data in which a falling edge exists at a central location of the bit corresponds to 0. When the bit data is continuously (0, 0) or (1, 1), H and L pulses having a length of ½ bit are continuous, and when the bit data is continuously (0, 1) or (1, 0), H or L pulse having a length of one bit appears between the central locations of both bits. Further, in each of FIGS. 5A to 5D, the indication at the center illustrates the deformation of the waveform when the data transmission speed is 4096 bps−1%, and the indication at the right side illustrates the deformation of the waveform when the data transmission speed is 4096 bps+1%.

In FIGS. 5A to 5D, the pulse edges 61 and 64 correspond to pulse edges of the boundary between the determined bit and the bit before the determined bit or pulse edges at the central locations of the bit before the determined bit, and a rising edge 61 in the receiving device 2 side and a falling edge 64 in the receiving device 2 side exist. In FIGS. 5A to 5D, the pulse edges 62 and 65 correspond the pulse edges at the central locations of the determined bit, and a rising edge 65 in the receiving device 2 side and a falling edge 62 in the receiving device 2 side exist. The bit data can be determined by the rising edge 65 and the falling edge 62. In FIGS. 5A to 5D, the pulse edges 63 and 66 correspond to pulse edges of the boundary between the determined bit and the bit after the determined bit, and a rising edge 63 in the receiving device 2 side and the falling edge 66 in the receiving device 2 side exist. In addition, the pulse edges 63 and 66 are generated at the boundary where the bit data 0 or 1 is continuous, but is not generated at the boundary where the bit data 0 or 1 is not continuous.

The deformation of the shape of the encoded data will be described with reference to a case in which the bit data shown in FIG. 5A is continuously (0, 0). First, a case will be described in which the data transmission speed is 4096 bps−1% (the center of FIG. 5A). In this indication, an ideal pulse width is 120.86 μs (time corresponding to a length of ½ bit in the transmitting device 1 side). When the data is transmitted from the transmitting device 1, a transmission delay occurs at a rising portion of the pulse edge. The transmission delay corresponds to a thinly hatched region in FIG. 5A, that is, an amount of delayed transmission is maximally 52 μs. Accordingly, in the receiving device 2 side, in the falling edge 62 at the center of the bit, the transmission delay is generated within a range of the falling edge 62 and the arrow adjacent to the falling edge 62 at the right side. In addition, in the falling edge of the pulse in the transmitting device 1 side, the transmission delay is not generated.

Next, when the encoded data is decoded and output in the receiving device 2 side, the above-mentioned process delay is generated. The process delay corresponds to a thickly hatched region in FIG. 5A, that is, the process delay is generated by 15% and a delayed amount is maximally 18.5 μs. The process delay is generated at all of the rising edge and the falling edge of the pulse edge. As a result, in the output waveform in the receiving device 2 side, the time between the rising edge 61 of the pulse edge and the falling edge 62 varies from 102.4 μs to 209.86 μs, and thus the time between the falling edge 62 and the rising edge 63 varies from 50.3 μs to 138.4 μs. Specifically, the time between the pulse edges of the pulse, which should be originally 120.86 μs and has the length of ½ bit, that is, the pulse width varies from 50.3 μs to 209.86 μs. In the meantime, when the data transmitting speed is 4096 bps+1% (right side of FIG. 5A), only the process delay is generated. Therefore, the time between the pulse edges of the pulse having the length of ½ bit (originally, 123.3 μs) varies from 104.8 μs to 141.8 μs. In other words, the pulse width varies from 104.8 μs to 141.8 μs.

In a case in which the bit data shown in FIG. 5B is continuously (1, 1), when the data transmission speed is 4096 bps−1% (the center of FIG. 5B), the width of the pulse having the length of ½ bit (originally, 120.86 μs) varies from 50.3 μs to 209.86 μs. In addition, when the data transmission speed is 4096 bps+1% (the right side of FIG. 5B), the width of the pulse having the length of ½ bit (originally, 123.3 μs) varies from 104.8 to 141.8 μs.

Next, a case in which the bit data shown in FIG. 5C is continuously (0, 1) will be explained. First, when the data transmission speed is 4096 bps−1% (the center of FIG. 5C), an ideal pulse width is 241.72 μs (time corresponding to a length of one bit in the transmitting device 1 side). When the data is transmitted from the transmitting device 1, a transmission delay occurs at a rising portion of the pulse edge. The transmission delay corresponds to a thinly hatched region in FIG. 5C, where an amount of delayed transmission is maximally 52 μs. Accordingly, in the receiving device 2 side, in the falling edge 64 of the front end of the bit, the transmission delay is generated within a range of the falling edge 62 and the arrow adjacent to the falling edge 62 at the right side. In addition, in the rising edge of the pulse edge in the transmitting device 1 side, the transmission delay is not generated.

Next, when the encoded data is decoded and output in the receiving device 2, the above-mentioned process delay is generated. The process delay corresponds to a thickly hatched region in FIG. 5C, that is, the process delay is generated by 15%, and a maximally delayed amount is 18.5 μs. The process delay is generated at all of the rising edges and the falling edges of the pulse edge. As a result, in the output waveform in the receiving device 2 side, the time between the rising edge 65 of the pulse edge and the falling edge 64 varies from 152.72 μs to 260.22 μs. In the meantime, when the data transmitting speed is 4096 bps+1% (right side of FIG. 5C), only the process delay is generated. Therefore, the width of the pulse having the length of ½ bit (originally, 246.6 μs) varies from 227.1 μs to 265.1 μs.

In a case in which the bit data shown in FIG. 5D is continuously (1, 0), when the data transmission speed is 4096 bps−1% (the center of FIG. 5D), the width of the pulse having the length of one bit (originally, 241.72 μs) varies from 223.22 μs to 330.72 μs. In addition, when the data transmission speed is 4096 bps+1% (the right side of FIG. 5D), the width of the pulse having the length of one bit (originally, 245.6 μs) varies from 227.1 to 265.1 μs.

In the pulse having the length of one bit, the pulse edges 62 and 65 of the terminating ends should be the pulse edges at the center of the bit. Accordingly, if the pulse edge is the rising edge 65, the bit data is 1, and if the pulse edge is the falling edge 62, the bit data is 0. The bit data determined in this way is stored in the storing unit 2321 of the arithmetic unit 232 of the control unit 23.

In the pulse having the length of ½ bit, the pulse edges of the terminating ends may be the pulse edges 62 and 65 at the center of the bit, and may be the pulse edges 61, 63, 64 and 66 at the boundary between the determined bit and the bits before and after the determined bit. Different from the pulse having the pulse width of the length of one bit, the bit data cannot be determined by only the information of rising or falling of the pulse edge. Therefore, according to the embodiment of the invention, focusing on the relationships between the data of the bit before the determined bit, that is, the rising or falling edge of the pulse edge at the center of the bit before the determined bit, and the rising or falling edge of the pulse edge to be determined, it is determined on the basis of the regularity in the relationship whether the pulse edge of the terminating terminal of the pulse having the length of ½ bit is the pulse edge at the center of the bit or the pulse edge of the boundary between the bits. In addition, when the pulse edge is located at the center of the bit, the bit data is determined by the rising or falling edge of the pulse edge. The bit data determined in this way is stored in the storing unit 2321 of the arithmetic unit 232 of the control unit 23.

If the newly detected pulse edge (pulse edge of the terminating end of the pulse whose pulse width is measured) is located at the center of the bit, the direction of the newly detected pulse edge should be equal to the direction of the pulse edge indicating the bit data that is stored in the storing unit 2321. For example, if the prior bit data is 0, the newly detected pulse edge should be the falling edge indicating 0. In addition, when it is determined that the newly detected pulse edge is the pulse edge located at the center of the pulse, the bit data is determined from the direction of the corresponding pulse edge. The newly detected pulse edge is located at the boundary of the bits (the front end of a next bit), the direction of the newly detected pulse edge is opposite to the direction of the pulse edge indicating the bit data that is stored in the storing unit 2321. In this way, when the pulse having the length of ½ bit is detected, it is determined whether the pulse edge is the pulse edge at the center of the bit or the pulse edge at the boundary between the bits, and thus the corresponding bit data can be determined.

Specifically, when the pulse having the length of ½ bit is detected (when the bit data of the determined bit is equal to the bit data of the bit before the determined bit), that is, when it is determined that the corresponding pulse is the pulse having the length of ½ bit by the pulse width determining unit 2322 in FIG. 2, the corresponding information is output to the edge determining unit 2323. By using the bit data stored in the storing unit 2321, the edge determining unit 2323 determines whether the pulse edge is the pulse edge at the center of the bit or the pulse edge at the boundary between the bits.

For example, when the stored bit data is 0, if the pulse edge is the rising edge, it is determined that the corresponding pulse edge is the pulse edge at the center of the bit data 0, and if the pulse edge is the falling edge, it is determined that the corresponding pulse edge is the pulse edge at the boundary between the edges of the bit data 0 (starting end of a next bit). When the stored bit data is 1, if the pulse edge is the rising edge, it is determined that the corresponding pulse edge is the pulse edge at the boundary between the edges of the bit data 1 (starting end of a next bit), and if the pulse edge is the falling edge, it is determined that the corresponding pulse edge is the pulse edge at the center of the bit data 1. The information determined in this way is output to the logical value determining unit 2324. In the logical value determining unit 2324, the bit data is determined by the rising edge or falling edge of the pulse edge at the center of the bit data. The bit data is updated by the logical value updating unit 2325, and then stored in the storing unit 2321.

In addition, in the measurement of the pulse width, each of an A region and an E region of FIG. 4 corresponds to a noise, a bit value is not determined in the B region of FIG. 4, and a bit value is determined in the D region of FIG. 4. The pulse width when the bit value is determined corresponds the times 54 to 57 having the length of ½ bit shown in FIG. 5, and the times 58 and 59 having the length of one bit. The time 54 having the length of ½ bit corresponds to the H time of the bit data 0 in the receiving device 2 side, the time 55 having the length of ½ bit corresponds to the L time of the bit data 0 in the receiving device 2 side, the time 56 having the length of ½ bit corresponds to the L time of the bit data 1 in the receiving device 2 side, and the time 57 having the length of ½ bit corresponds to the H time of the bit data 1 in the receiving device 2 side. In addition, the time 58 having the length of one bit corresponds to the L time when the bit data is continuously (1, 0) in the receiving device 2 side, and the time 59 having the length of one bit corresponds to the H time when the bit data is continuously (0, 1) in the receiving device 2 side. When the pulse width corresponds to the region of FIG. 4B, a portion of the times 55 and 56 having the length of ½ bit and the times 54 and 57 having the length of ½ bit is detected, and when the pulse width corresponds to the region of FIG. 4C, a residual portion of the times 54 and 57 having the length of ½ bit and a portion of the time 58 having the length of one bit are detected. When the pulse width corresponds to the D region of FIG. 4D, the residual portion of the time 58 having the length of one bit and the time 59 having the length of one bit are detected.

In the present embodiment, at the time of the determination of the bit data, the bit data is determined on the basis of the direction of the pulse edge, the pulse width, and the data of the bit before the determined bit. That is, the direction of the pulse edge and the pulse width are measured, and the determined result of the direction of the pulse edge is combined in accordance with the measured value of the pulse value, if necessary. Then, it is selected whether the determination process is performed for the pulse having the length of one bit or for the pulse having the length of ½ bit. Further, it is determined whether the current pulse edge is a pulse edge at the center of the bit or the pulse edge at the boundary between bits while considering the determined result of the direction of the pulse edge and the bit data right before the determined bit. In addition, when it is determined that the current pulse edge is the pulse edge at the center of the bit, the bit data is determined by the rising edge or falling edge of the pulse edge.

Figure 6:
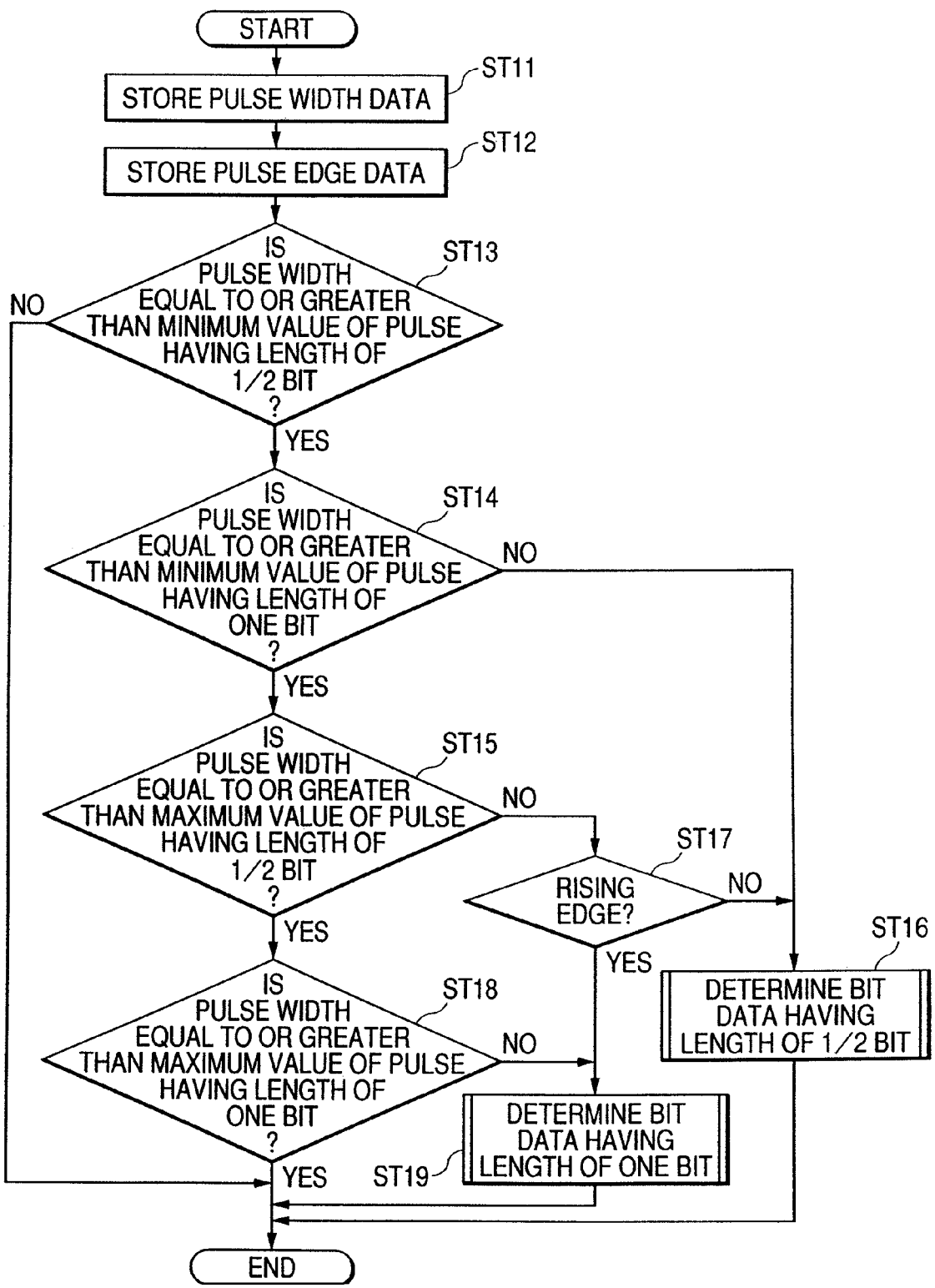
FIG. 6 is a flowchart illustrating a determination process of bit data of a receiving device according to an embodiment of the invention.
Figure 7:
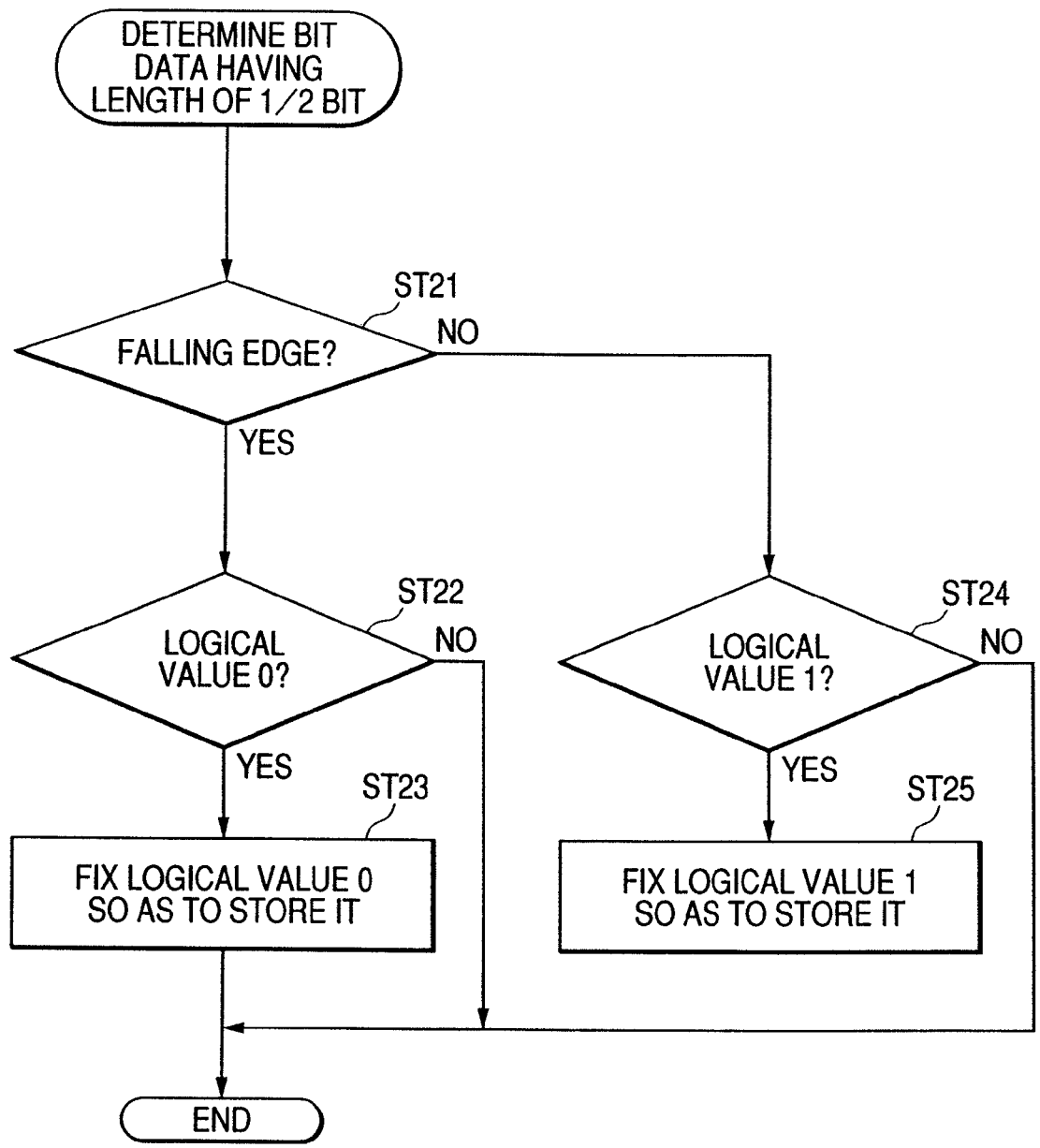
FIG. 7 is a flowchart illustrating bit data determination of a pulse having a length of ½ bit in a flowchart illustrated in FIG. 6.
Figure 8:
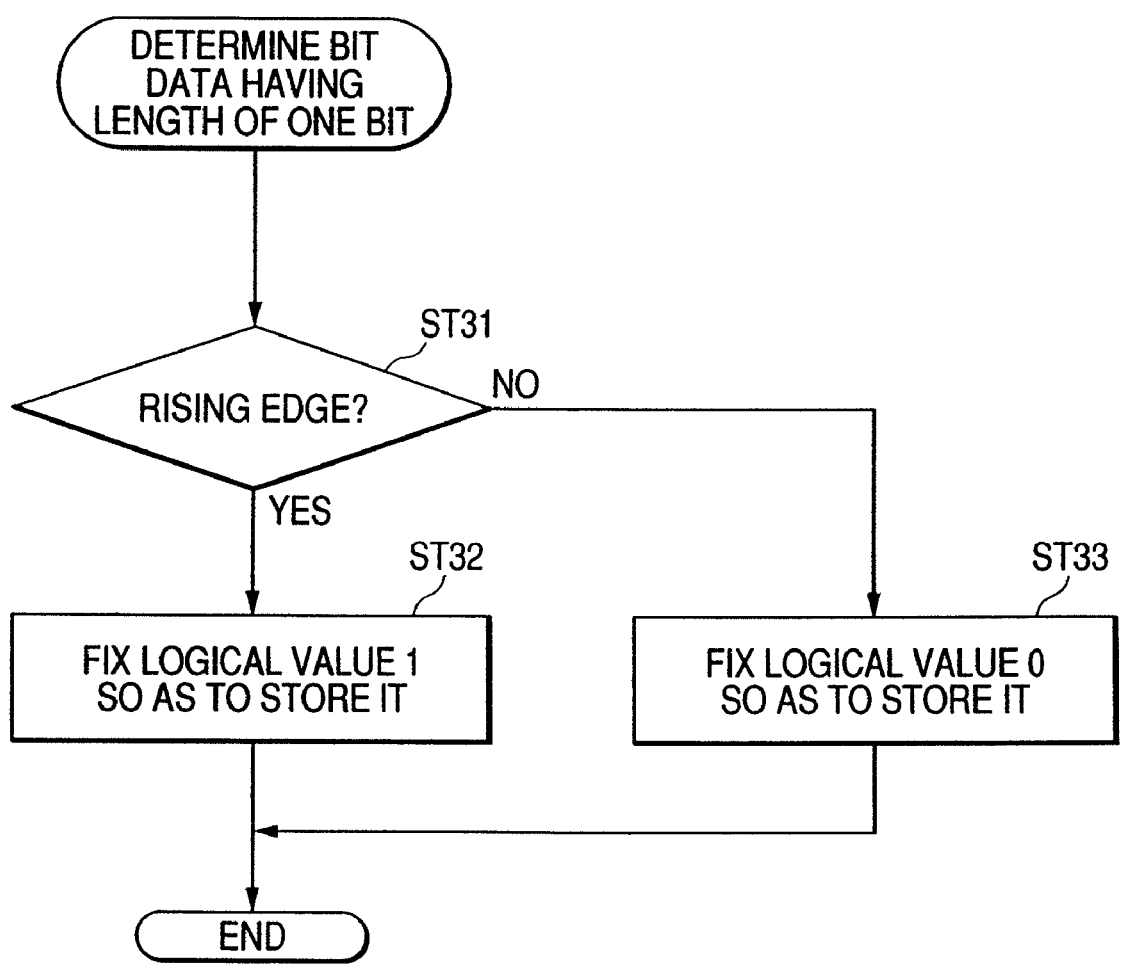
FIG. 8 is a flowchart illustrating bit data determination of a pulse having a length of one bit in a flowchart illustrated in FIG. 6.

Next, the determination process of the bit data (decoding process) will be described with reference to FIGS. 6 to 8. FIG. 6 is a flowchart illustrating the determination process of the bit data of the receiving device according to the embodiment of the invention. FIG. 7 is a flowchart illustrating the bit data determination of the pulse having the length of ½ bit in the flowchart illustrated in FIG. 6. FIG. 8 is a flowchart illustrating the bit data determination of the pulse of the length of one bit in the flowchart illustrated in FIG. 6.

The reading process of the pulse width is executed by detecting the rising edge and the falling edge by the control of the interrupt control unit 231 and performing the measurement of the measuring unit 233. In this case, the initiation of the bit data is made from the final bit data 1 of the start bit. Accordingly, the initiation of the bit data is made from the rising edge. The measurement of the pulse width starts from the previously determined pulse edge (at the time of start, the rising edge), a change point of a next pulse edge (pulse edge of the subject that determines the bit data, and the falling edge right after the start) is detected, a pulse width between the previous pulse edge and the pulse edge of the determination subject (hereinafter, simply referred to as pulse width) is decided, the decided pulse width data is stored in the storing unit 2321 (ST11), and the pulse edge of the determination subject is also stored in the storing unit 2321 (ST12).

Next, the pulse width determining unit 2322 determines the pulse width. That is, it is determined whether the pulse width is equal to or greater than a minimum value of a variation range of a basic pulse width 122 μs of the pulse having the length of ½ bit (ST13). If the pulse width is less than a minimum value of a variation range of a basic pulse width 122 μs of the pulse having the length of ½ bit, this case corresponds to an A region of FIG. 4, and the determination of the bit data as the noise is not performed.

If the pulse width is equal to or greater than a minimum value of a variation range of the pulse having the length of ½ bit, it is determined whether the pulse width is equal to or greater than a minimum value of a variation range of a basic pulse width 244 μs of the pulse having the length of one bit (ST14). If the pulse width is less than the minimum value of the variation range of the pulse having the length of one bit, this case corresponds to the B region of FIG. 4, and the determination process of the bit data of the pulse having the length of ½ bit is performed (ST16). If the pulse width is equal to or greater than a minimum value of a variation range of the pulse having the length of one bit, it is determined whether the pulse width is equal to or greater than a maximum value of a variation range of the pulse having the length of ½ bit (ST15).

If the pulse width is less than a maximum value of a variation range of the pulse having the length of ½ bit, this case corresponds to the C region in FIG. 4 and a tolerance overlapping region, and the determination of the pulse edge is performed. That is, in the C region, since the falling edge of the bit data 1→1 and the rising edge of the bit data 0→1 overlap each other, the pulse edge is determined so as to switch the determination process. Accordingly, it is determined whether the pulse edge is a rising edge or not (ST 17). If the pulse edge is a rising edge, since it corresponds to a sequence of the bit data of FIG. 5C, the determination process of bit data of the pulse having the length of one bit is performed (ST 19). If the pulse edge is not the rising edge (if it is the falling edge), since it corresponds to a sequence of the bit data of FIG. 5B, the determination process of bit data of the pulse having the length of ½ bit is performed (ST 16).

In addition, if the pulse width is equal to or greater than a maximum value of a variation range of the pulse having the length of ½ bit, it is determined whether the pulse width is equal to or greater than a maximum value of a variation range of the pulse having the length of one bit (ST18). In this case, if the pulse width is equal to or greater than the maximum value of a variation range of the pulse having the length of one bit, it corresponds to the D region in FIG. 4, and the determination process of the bit data of the pulse having the length of one bit is performed (ST19). If the pulse width is not less than a maximum value of a variation range of the pulse having the length of one bit, it corresponds to the E region in FIG. 4, and the determination of the bit data as the noise is not performed.

The determination process of the bit data of the pulse having the length of ½ bit is performed in accordance with a sequence shown in FIG. 7. That is, it is determined whether the pulse edge of the terminating end of the pulse having the length of ½ bit is the falling edge or not (ST21). The determination of the data bit is performed by using the bit data of the bit before the determined bit. In this case, if the pulse edge is the falling edge, it is determined whether the bit data (logical value) is 0 (ST22). If the bit data is 0, the bit data 0 is decided, and the bit data is updated by the logical value updating unit 2325 so as to be stored in the storing unit 2321 (ST23). If the bit data is not 0, since it corresponds to the pulse edge indicating the boundary between the bits, nothing is performed. If the pulse edge is not the falling edge (if it is the rising edge), it is determined whether the bit data (logical value) is 1 (ST24). If the bit data is 1, the bit data 1 is decided, the bit data is updated by the logical value updating unit 2325 so as to be stored in the storing unit 2321 (ST25). If the bit data is not 1, since it corresponds to the pulse edge indicating the boundary between the bits, nothing is performed.

The determination process of the bit data of the pulse having the length of one bit is performed in accordance with a sequence shown in FIG. 8. Since the pulse edge of the terminating end of the pulse having the length of one bit is located at the center of the bit, the bit data is determined on the basis of the rising edge or the falling edge of the pulse edge. In other words, it is determined whether the pulse edge is the rising edge (ST31). If the pulse edge is the rising edge, the bit data 1 is decided, and the bit data is updated by the logical value updating unit 2325 so as to be stored in the storing unit 2321 (ST32). If the pulse edge is not the rising edge (if it is the falling edge), the bit data 0 is decided, and the bit data is updated by the logical value updating unit 2325 so as to be stored in the storing unit 2321 (ST33).

As described above, the receiving device according to the present embodiment determines the bit data of the encoded data on the basis of the pulse width, the rising or falling edge of the pulse end, and the bit data before the determined bit. The data that is encoded with a Manchester code is characterized by the pulse representing the bit. In other words, there is the regularity in the relationship between the determined bit and the bit before the determined bit. For this reason, the bit data is determined on the basis of the relationship, the data of the pulse width, and the discrimination of the rising edge or falling edge of the pulse end. Therefore, the bit data can be determined without the erroneous determination even if the carrier wave frequency, the pulse width, and the timing of the rising edge or falling edge vary. In this case, when the bit data of the determined bit and the bit data of the bit before the determined bit are equal to each other, the bit data is determined while including the determination result of the pulse edge, and it can be determined whether the pulse edge of the pulse width having the length of ½ bit in the Manchester code is the pulse edge at the center of the bit used for the determination of the bit data or the pulse edge at the boundary between bits that are not used for the determination of the bit data, which results in accurate determination of the bit data. Further, in the tire pressure monitoring system having the receiving device, the detected tire pressure can be accurately displayed on the display as the accurate tire pressure data, and thus, it is possible to make the accurate tire pressure data recognized by the driver.

The invention is not limited to the above-mentioned embodiments, and various changes can be made. The numerical values in the above-mentioned embodiments are only exemplary, and the invention is not limited thereto. In the above-mentioned embodiments, the case has been described in which the receiving device is applied to the tire pressure monitoring system, but the invention is not limited thereto, and may be applied to the receiving device in the communication system using the Manchester code. In addition, various changes and modifications can be made without departing from the spirit or scope of the invention.

In the receiving device and the tire pressure monitoring system according to the embodiment of the invention, the bit value of the encoded data is determined on the basis of the pulse width, the determination of the rising edge or falling edge of the pulse end, and the value of the bit before the determined bit. Therefore, the data that has been encoded with the Manchester code can be determined without the erroneous determination even if the carrier wave frequency, the pulse width, and the timing of the rising edge or falling edge of the pulse vary.

The invention claimed is:

1. A receiving device comprising:
   a receiving unit that receives encoded data encoded with a Manchester code in which a plurality of pulses comprising a high pulse and a low pulse are combined with each other so as to represent a bit;
   a measuring unit that measures a pulse width of the pulses in the encoded data;
   an edge determining unit that determines direction of an edge of an end of the pulse which is rising or falling, and
   a logical value determining unit that determines a bit data of the encoded data on the basis of the pulse width of the pulse, the direction of the edge of the end of the pulse, and a bit data of a bit before the determined bit,
   wherein when the edge of the end of the pulse is detected newly, the logical value determining unit determines whether the pulse is a pulse having length of 1 bit or a pulse having length of ½ bit, and determines whether the edge of the end of the pulses is positioned at a center of the determining bit or at a boundary between bits, then determines the bit data of the determining bit.

2. A tire pressure monitoring system comprising:
   the receiving device according to claim 1;
   a transmitting device comprising:
   an encoding unit that encodes data indicating a tire pressure with a Manchester code, in which a high pulse and a low pulse are combined with each other so as to represent a bit, so as to obtain the encoded data;
   a transmitting unit to transmit the encoded data.

3. The tire pressure monitoring system according to claim 2, wherein the transmitting device is mounted in a tire and the receiving device is mounted in a vehicle body.

4. The tire pressure monitoring system according to claim 2, wherein the data decoded by the receiving device is transmitted to a display that is disposed in the vehicle body, when the decoded data is required.

5. The tire pressure monitoring system according to claim 2, wherein the transmitting device includes a sensor that detects a tire pressure, a control unit that encodes data indicating the tire pressure detected by the sensor with the Manchester code, and an RF circuit that modulates a carrier wave with the encoded data and transmits it to the receiving device.

6. The tire pressure monitoring system according to claim 2, wherein the receiving device includes a tuner circuit that receives an electric wave transmitted from the transmitting device, and a control unit that decodes the encoded data received by the tuner circuit and transmits the decoded tire pressure data to the display.

7. The tire pressure monitoring system according to claim 6, wherein the control unit includes an interruption control unit that controls the interruption of the measurement of a pulse width of the data encoded with the Manchester code, a measuring unit, a counter that measures a pulse width of the encoded data, an arithmetic unit that performs the arithmetic for determining a bit data of the encoded data, an ROM that stores control program, an RAM that stores various data so as to be rewritten, and a communication control unit that performs the control when the decoded tire pressure data is transmitted to the display.

8. The tire pressure monitoring system according to claim 7, wherein the arithmetic unit of the control unit has a storing unit that stores pulse width data or pulse edge data.

* * * * *